United States Patent
Ohira et al.

(10) Patent No.: US 7,138,364 B2
(45) Date of Patent: Nov. 21, 2006

(54) CLEANING GAS AND ETCHING GAS

(75) Inventors: Yutaka Ohira, Tokyo (JP); Yuki Mitsui, Tokyo (JP); Taisuke Yonemura, Tokyo (JP); Akira Sekiya, Ibaraki (JP)

(73) Assignees: Asahi Glass Company, Limited, Tokyo (JP); Anelva Corporation, Tokyo (JP); Ulvac, Inc., Chigasaki (JP); Kanto Denka Kogyo Co., Ltd., Tokyo (JP); Sanyo Electric Co., Ltd., Moriguchi (JP); Sony Corporation, Tokyo (JP); Daikin Industries, Ltd., Osaka (JP); Hitachi Kokusai Electric Inc., Tokyo (JP); Fujitsu Limited, Kawasaki (JP); Matsushita Electric Industrial Co., Ltd., Kadoma (JP); Renesas Technology Corp., Tokyo (JP); National Institute of Advanced Industrial Science and Technology, Tokyo (JP)

( * ) Notice: Subject to any disclaimer, the term of this patent is extended or adjusted under 35 U.S.C. 154(b) by 100 days.

(21) Appl. No.: 10/480,285

(22) PCT Filed: Jan. 28, 2003

(86) PCT No.: PCT/JP03/00804

§ 371 (c)(1),
(2), (4) Date: Dec. 11, 2003

(87) PCT Pub. No.: WO03/069659

PCT Pub. Date: Aug. 21, 2003

(65) Prior Publication Data
US 2004/0173569 A1    Sep. 9, 2004

(30) Foreign Application Priority Data
Feb. 12, 2002    (JP)    ............... 2002-034460

(51) Int. Cl.
*B08B 9/00*    (2006.01)
(52) U.S. Cl. .............. 510/506; 216/58; 252/79.3; 134/1.3; 438/706
(58) Field of Classification Search .................. None
See application file for complete search history.

(56) References Cited

U.S. PATENT DOCUMENTS

| 4,281,119 | A  | * | 7/1981 | Lagow et al. ............... 544/106 |
| 5,861,065 | A  | * | 1/1999 | Johnson .................... 134/22.1 |
| 6,537,461 | B1 | * | 3/2003 | Nakahara et al. ............. 216/67 |
| 6,872,322 | B1 | * | 3/2005 | Chow et al. ................. 216/67 |
| 6,884,365 | B1 | * | 4/2005 | Hirayama et al. .......... 252/79.1 |
| 2005/0178731 | A1 | * | 8/2005 | Hirayama et al. .......... 210/664 |

FOREIGN PATENT DOCUMENTS

| JP | 60-77429 | 5/1985 |
| JP | 1-265086 | 10/1989 |
| JP | 4-316577 | 11/1992 |
| JP | 5-503104 | 5/1993 |
| JP | 6-87848 | 3/1994 |
| JP | 8-291299 | 11/1996 |
| WO | WO 91/09025 | 6/1991 |

* cited by examiner

*Primary Examiner*—Gregory Webb
(74) *Attorney, Agent, or Firm*—Oblon, Spivak, McClelland, Maier & Neustadt, P.C.

(57) ABSTRACT

A chamber-cleaning gas and an etching gas used for a silicon-containing film according to the present invention comprise a perfluoro cyclic ether having 2 to 4 carbon atoms which are ether-linked with carbon atoms. The chamber-cleaning gas and the etching gas hardly generate a harmful waste gas, such as $CF_4$, which is one of the causes for global warming so that they are good for environment. Further, they are a non-toxic gas or a volatile liquid, and are easy to use and are excellent in treatment of waste gas. Additionally, the chamber-cleaning gas of the present invention has an excellent cleaning rate.

16 Claims, No Drawings

CLEANING GAS AND ETCHING GAS

FIELD OF THE INVENTION

The present invention relates to a chamber-cleaning gas and an etching gas. More particularly, it relates to a chamber-cleaning gas and an etching gas, such as $CF_4$, from which waste gas is hardly generate, said gases comprising a fluorine-containing cyclic ether compound and having excellent cleaning efficiency and etching efficiency.

BACKGROUND OF THE INVENTION

Various thin films and thick films have been conventionally formed by a CVD method, etc. in production processes for thin film devices in semiconductor productions, etc. In forming such thin films for semiconductors, a thin film material unfavorably attaches to parts other than a target for forming films, said parts being the inner wall of a reactor, jigs for supporting the target, pipes and the like. Such a deposit induces contamination of fine particles into semiconductor products. As a result, it is difficult to produce a high quality thin film, and the contamination occasionally brings about lowering in the yield of products. Therefore, it is necessary to remove such a deposit at any time. Usually, the deposit has been removed with hands, cleaning gases and the like.

In semiconductors, etc., thin film materials have been partly removed by the use of gas etching in order to form circuit patterns of the various thin film materials for constituting semiconductor circuits.

The basic properties required for these gases are a high cleaning rate for the cleaning gas and a high etching rate to a target and high selectivity for the etching gas. Additionally, both of the gases, from which harmful gases for environment are not generated preferably, are desired to have a low load for global environment.

Conventionally, in the step of producing semiconductor devices, large amounts of fluorine gases, such as $CF_4$, $C_2F_6$, $SF_6$ and $NF_3$, have been used as a gas for cleaning such deposits or as a gas for etching thin films.

These fluorine gases, however, are stable compounds having long atmospheric lifetime. The fluorine gases have a problem in that after cleaning or etching, it is difficult to treat un-decomposed gases and the cost for the treatment is high. The fluorine gases, further, have a very higher global warming potential (100-year integrated global warming potential) as compared with $CO_2$. For example, the global warming potential of $CF_4$ is 5,700 times, that of $C_2F_6$ is 11,900 times, that of $SF_6$ is 22,200 times and that of $NF_3$ is 10,800 times higher than that of $CO_2$, so that they have a fear of adverse impacts on the environment. Consequently, the development of alternative gases having a low global warming potential and excellent capability of cleaning off a deposit containing silicon in semiconductors, or excellent capability of etching a film containing silicon has been desired.

Further, even if the gases used have themselves no much influence on the environment, by decomposing these gases after cleaning or etching, gases having a long atmospheric life, such as $CF_4$, which are harmful to the environment, may be generated. Therefore, the development of alternative gases which have no harmful influence on the environment even after the decomposition has been desired.

OBJECT OF THE INVENTION

It is an object of the present invention to provide a gas for cleaning a chamber in a CVD apparatus, etc., said gas having excellent capability of removing a silicon-containing deposit, i.e. cleaning capability, and being suitable for use in semiconductor production, and to provide an etching gas having excellent capability of etching a silicon-containing film. From both these gases, waste gases such as $CF_4$ are hardly generated, said waste gases being harmful for environment and causing global warming. Further, exhaust gases from the cleaning gas and etching gas can be easily treated and handled.

DISCLOSURE OF THE INVENTION

With the view of solving the problems as described above, the present inventors prosecuted extensive researches and found that from a gas comprising a specific cyclic ether compound containing fluorine, waste gases such as $CF_4$ are hardly generated after cleaning or etching, said waste gases being harmful for environment and influencing on global warming. Further, the inventors found that the gas comprising the cyclic ether compound containing fluorine have excellent cleaning efficiency or etching efficiency and, moreover, cleaning capability of removing a silicon-containing deposit or capability of etching a silicon-containing film. Thus, the present invention is eventually accomplished.

The chamber-cleaning gas of the present invention comprises a perfluoro cyclic ether having 2 to 4 oxygen atoms which are ether-linked with carbon atoms.

The perfluoro cyclic ether is preferably represented by the formula (1):

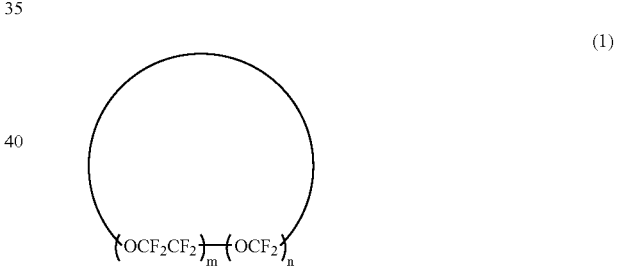

(1)

in which m is an integer of 0 to 2 and n is an integer of 0 to 3, provided that m and n are not simultaneously zero, they are not simultaneously m=0 and n=1, they are not simultaneously m=1 and n=0, and they are not simultaneously m=2 and n=3.

The perfluoro cyclic ether is preferably a cyclic ether having five- to eight-membered ring.

The chamber-cleaning gas preferably further comprises $O_2$ and optionally other gas. In this case, the total amount of the perfluoro cyclic ether and $O_2$ is preferably 10 to 100 mol %, more preferably 70 to 100 mol % based on 100 mol % of the total gas amount.

The molar ratio of perfluoro cyclic ether to $O_2$ (perfluoro cyclic ether/$O_2$) preferably satisfies the formula:

0.1≦perfluoro cyclic ether/$O_2$≦9, more preferably 0.10≦perfluoro cyclic ether/$O_2$≦6.

The perfluoro cyclic ether is preferably at least one compound selected from perfluoro-1,3-dioxolane (c-$C_3F_6O_2$), perfluoro-1,4-dioxane (c-$C_4F_8O_2$) and perfluoro-1,3,5-trioxane (c-$C_3F_6O_3$).

The other gas preferably comprises at least one inert gas selected from $N_2$, He, Ne, Ar, Kr, Xe and Rn.

The chamber-cleaning gas is preferably used for cleaning a chamber of a CVD apparatus.

The chamber-cleaning gas is preferably used for removing a silicon-containing deposit.

The silicon-containing deposit preferably comprises at least one compound selected from (1) silicon;

(2) a compound comprising silicon and at least one element of oxygen, nitrogen, fluorine and carbon; and (3) a compound comprising a metal silicide with high melting point.

The etching gas used for a silicon-containing film according to the present invention comprises a perfluoro cyclic ether having 2 to 4 oxygen atoms which are ether-linked with carbon atoms.

The perfluoro cyclic ether is preferably represented by the formula (1):

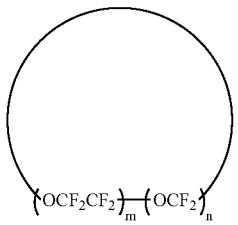

(1)

in which m is an integer of 0 to 2 and n is an integer of 0 to 3, provided that m and n are not simultaneously zero, they are not simultaneously m=0 and n=1, they are not simultaneously m=1 and n=0, and they are not simultaneously m=2 and n=3.

The perfluoro cyclic ether is preferably a cyclic ether having a five- to eight-membered ring.

Further, the etching gas used for a silicon-containing film preferably comprises $O_2$ and optionally other gas. In this case, the total amount of the perfluoro cyclic ether and $O_2$ is preferably 70 to 100 mol % based on 100 mol % of the total gas amount.

The molar ratio of perfluoro cyclic ether to $O_2$ (perfluoro cyclic ether/$O_2$) preferably satisfies the formula:

$0.1 \leq$ perfluoro cyclic ether/$O_2$.

The perfluoro cyclic ether is preferably at least one compound selected from perfluoro-1,3-dioxolane ($c$-$C_3F_6O_2$), perfluoro-1,4-dioxane ($c$-$C_4F_8O_2$) and perfluoro-1,3,5-trioxane ($c$-$C_3F_6O_3$).

PREFERRED EMBODIMENTS OF THE INVENTION

The chamber-cleaning gas for removing a silicon-containing deposit and the etching gas used for a silicon-containing film according to the present invention comprise a specific perfluoro cyclic ether. The gases will be described in detail below.

Chamber-cleaning Gas

The chamber-cleaning gas of the present invention comprises a perfluoro cyclic ether having 2 to 4 oxygen atoms which are ether-linked with carbon atoms, and the number of the oxygen atom is desirably 2 or 3.

The perfluoro cyclic ether is preferably represented by the formula (1):

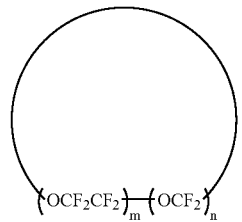

(1)

In the formula (1), m is an integer of 0 to 2 and n is an integer of 0 to 3, provided that m and n are not simultaneously zero, they are not simultaneously m=0 and n=1, they are not simultaneously m=1 and n=0, and they are not simultaneously m=2 and n=3. In the formula (1), the curved solid line shows that both ends of a repeating unit are linked via a single bond.

The perfluoro cyclic ether is a cyclic ether having preferably a five- to eight-membered ring, more preferably a five- to seven-membered ring, still more preferably five- or six-membered ring.

Examples of the perfluoro cyclic ether include perfluoro-1,3-dioxolane (in the specification, occasionally, referred to as "$c$-$C_3F_6O_2$"), perfluoro-1,4-dioxane (in the specification, occasionally, referred to as "$c$-$C_4F_8O_2$") and perfluoro-1,3,5-trioxane (in the specification, occasionally, referred to as "$c$-$C_3F_6O_3$"). It is preferred to use at least one compound selected from the group consisting of the above-mentioned ethers.

The chamber-cleaning gas containing the specific perfluoro cyclic ether preferably contains oxygen gas ($O_2$).

Using the chamber-cleaning gas containing such a perfluoro cyclic ether, the generation of $CF_4$ can be reduced remarkably. Further, such a chamber-cleaning gas has a very high decomposition rate of the used perfluoro cyclic ether and excellent cleaning efficiency.

Furthermore, the chamber-cleaning gas may optionally contain other gas in addition to the specific perfluoro cyclic ether and oxygen gas.

When the chamber-cleaning gas of the invention comprises the perfluoro cyclic ether such as $c$-$C_3F_6O_2$, $c$-$C_4F_8O_2$ or $c$-$C_3F_6O_3$, $O_2$ and optionally the other gas, the total amount of the perfluoro cyclic ether and $O_2$ is preferably 10 to 100 mol %, more preferably 70 to 100 mol %, specifically 80 to 100 mol % based on 100 mol % of the total gas amount.

The molar ratio of the perfluoro cyclic ether such as $c$-$C_3F_6O_2$, $c$-$C_4F_8O_2$ or $c$-$C_3F_6O_3$, to $O_2$ (perfluoro cyclic ether/$O_2$, e.g., $c$-$C_3F_6O_2/O_2$, $c$-$C_4F_8O_2/O_2$ or $c$-$C_3F_6O_3/O_2$), desirably satisfies the formula:

$0.1 \leq$ (perfluoro cyclic ether/$O_2$, e.g., $c$-$C_3F_6O_2/O_2$, $c$-$C_4F_8O_2/O_2$ or $c$-$C_3F_6O_3/O_2$) $\leq 9$, preferably $0.1 \leq$ (perfluoro cyclic ether/$O_2$, e.g., $c$-$C_3F_6O_2/O_2$, $c$-$C_4F_8O_2/O_2$ or $c$-$C_3F_6O_3/O_2$) $\leq 6$, more preferably $0.1 \leq$ (perfluoro cyclic ether/$O_2$, e.g., $c$-$C_3F_6O_2/O_2$, $c$-$C_4F_8O_2/O_2$ or $c$-$C_3F_6O_3/O_2$) $\leq 3$.

Examples of the other gas, which is contained in the chamber-cleaning gas containing the perfluoro cyclic ether, include inert gases such as $N_2$, He, Ne, Ar, Kr, Xe and Rn. The inert gases may be used singly or in a mixed gas of two or more.

When the chamber-cleaning gas of the invention has a gas content and a mixing molar ratio in the above ranges, it is possible to attain the cleaning rate same as that of $C_2F_6$ conventionally used and also to remove a deposit attached to a chamber rapidly.

Usually, the exhaust gas obtained after cleaning a chamber contains a by-product generated by decomposition of the above cleaning gas. When the chamber cleaning is carried out using $C_2F_6$ as described above, the exhaust gas contains $CF_4$ that has a long atmospheric life of 50,000 years and a high global warming potential. On the other hand, when the chamber-cleaning gas of the invention, which contains perfluoro cyclic ether, is used, it is possible to attain the cleaning rate same as that of $C_2F_6$ and also to decrease the $CF_4$ content in the exhaust gas markedly as compared with the use of $C_2F_6$.

The chamber-cleaning gas of the invention also has a very high decomposition rate of the gas used (perfluoro cyclic ether is used in the present invention) and excellent cleaning efficiency as compared with $C_2F_6$.

As a result, the use of the perfluoro cyclic ether, for example, $c\text{-}C_3F_6O_2/O_2$, $c\text{-}C_4F_8O_2/O_2$ or $c\text{-}C_3F_6O_3/O_2$ can save on the equipment cost for a decomposition treatment equipment conventionally used, such as with combustion.

In the case of using $C_2F_6$ as a cleaning gas, if the electric power for cleaning is increased, the proportion of the waste gas such as $CF_4$ contained in exhaust gas is increased. On the other hand, when the chamber-cleaning gas of the invention is used, the increase of the proportion of the waste gas such as $CF_4$ can be restrained markedly.

Furthermore, $c\text{-}C_3F_6O_2$ as described above has a low boiling point of $-22.1°$ C. and is a nontoxic gas under semiconductor production conditions so that $c\text{-}C_3F_6O_2$ has easy handling in the chamber cleaning.

$c\text{-}C_4F_8O_2$ as described above has a low boiling point of 18 to 20° C. and it is thinkable that $c\text{-}C_4F_8O_2$ is a less toxic and volatile liquid under semiconductor production conditions so that $c\text{-}C_4F_8O_2$ has easy handling in the chamber cleaning.

It is presumed that the $c\text{-}C_3F_6O_3$ as described above is a less toxic gas under semiconductor production conditions so that $c\text{-}C_3F_6O_3$ has easy handling in the chamber cleaning.

Among $c\text{-}C_3F_6O_2$, $c\text{-}C_4F_8O_2$ and $c\text{-}C_3F_6O_3$, it is preferred to use $c\text{-}C_3F_6O_2$ from the standpoint of easy handling.

The process for producing the perfluoro cyclic ether used in the present invention is not particularly limited, and the perfluoro cyclic ether can be produced employing a conventional process. For example, corresponding cyclic ether can be perfluorinated with fluorine gas.

The process for producing $c\text{-}C_3F_6O_2$ is not particularly limited, and $c\text{-}C_3F_6O_2$ can be produced employing a conventional process. That is, $c\text{-}C_3H_6O_2$ is allowed to react with fluorine gas to prepare $c\text{-}C_3F_6O_2$. $c\text{-}C_3F_6O_2$ can be also prepared by the process as described in JP-A-6(1994)-87848. Specifically, $CF_2(OF)_2$ is allowed to react with tetrafluoroethylene gas in Fluorinert FC25 to prepare perfluoro-1,3-dioxolane.

The process for producing $c\text{-}C_4F_8O_2$ is not particularly limited, and $c\text{-}C_4F_8O_2$ can be produced employing a conventional process. For example, $c\text{-}C_4F_8O_2$ can be prepared by the process as described in U.S. Pat. No. 4,113,435. Specifically, dioxane is allowed to react with fluorine gas to prepare perfluoro-1,4-dioxane.

The process for producing $c\text{-}C_3F_6O_3$ is not particularly limited, and $c\text{-}C_3F_6O_3$ can be produced employing a conventional process. For example, $c\text{-}C_3F_6O_3$ can be prepared by the process as described in U.S. Pat. No. 4,113,435. Specifically, trioxane ($c\text{-}C_3H_6O_3$) is allowed to react with fluorine gas to prepare perfluoro-1,3,5-trioxane.

(Other Arbitrary Component)

The other gas as described above, further, may contain gases except for the above inert gases within the limit of not missing the object of the present invention. Examples of the gases except for the inert gases may include $O_3$, $H_2$, $F_2$, $ClF_3$, $BrF_3$ and $NF_3$.

<Chamber Cleaning>

The chamber cleaning described in the present specification means removal of a deposit attached to chamber walls, jigs, pipes and the like in a semiconductor producing apparatus such as a CVD apparatus.

The chamber-cleaning gas of the invention is preferably used as a gas for cleaning a chamber in a CVD apparatus or the like.

Examples of a target compound for the chamber cleaning with the chamber-cleaning gas of the invention include a deposit containing silicon (a silicon-containing deposit) attached to walls of a CVD chamber, jigs of a CVD apparatus or the like in a CVD method.

The silicon-containing deposit comprises at least one compound selected from (1) silicon;

(2) a compound comprising silicon and at least one element of oxygen, nitrogen, fluorine and carbon; and (3) a compound comprising a metal silicide with high melting point.

Specific examples thereof include Si; $SiO_2$; $Si_3N_4$; metal suicides with high melting point such as WSi; etc.

The materials for the chamber that can be cleaned with the chamber-cleaning gas of the invention are not particularly limited and may comprise conventionally known materials. Examples of the materials for a chamber include stainless steel, aluminum and alloys thereof.

The chamber-cleaning gas of the invention can selectively and rapidly remove the deposit attached to the chamber without a damaging effect such as corrosion on the chamber.

In cleaning off the silicon-containing deposit in the chamber using the fluorine compound of the invention, a conventionally known process can be employed. For example, various dry cleaning methods such as plasma cleaning, remote plasma cleaning, microwave cleaning are employable.

The use of the chamber cleaning gas of the invention enables the removal of the silicon-containing deposit.

Etching Gas for Silicon-containing Film

The etching gas used for a silicon-containing film according to the present invention is a gas containing a perfluoro cyclic ether having 2 to 4 oxygen atoms which are ether-linked with carbon atoms. The number of the oxygen atom is desirably 2 or 3.

The perfluoro cyclic ether is preferably represented by the formula (1):

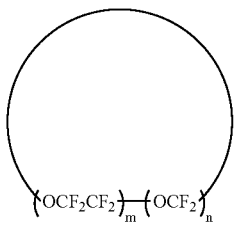

(1)

In the formula (1), m is an integer of 0 to 2 and n is an integer of 0 to 3, provided that m and n are not simultaneously zero, they are not simultaneously m=0 and n=1, they are not simultaneously m=1 and n=0, and they are not simultaneously m=2 and n=3. The curved solid line in the formula (1) shows that the both ends of a repeating unit are linked via a single bond.

The perfluoro cyclic ether is a cyclic ether having preferably a five- to eight-membered ring, more preferably five- to seven-membered ring, still more preferably five- or six-membered ring.

Examples of the perfluoro cyclic ether include the perfluoro-1,3-dioxolane ($c$-$C_3F_6O_2$), perfluoro-1,4-dioxane ($c$-$C_4F_8O_2$) and perfluoro-1,3,5-trioxane ($c$-$C_3F_6O_3$) same as those described in the chamber-cleaning gas. It is preferred to use at least one compound selected from the group consisting of the above-mentioned ethers.

The etching gas for a silicon-containing film, which contains the specific perfluoro cyclic ether, preferably contains oxygen gas ($O_2$).

Using the etching gas for a silicon-containing film, which contains such a perfluoro cyclic ether, the generation of $CF_4$ can be reduced remarkably. Further, such an etching gas for a silicon-containing film has a very high decomposition rate of the used perfluoro cyclic ether and excellent etching efficiency.

When the etching gas of the invention comprises the perfluoro cyclic ether such as $c$-$C_3F_6O_2$, $c$-$C_4F_8O_2$ or $c$-$C_3F_6O_3$, $O_2$ and optionally the other gas, the total amount of the perfluoro cyclic ether and $O_2$ is preferably 70 to 100 mol %, more preferably 80 to 100 mol % based on 100 mol % of the total gas amount.

The molar ratio of perfluoro cyclic ether such as $c$-$C_3F_6O_2$, $c$-$C_4F_8O_2$ or $c$-$C_3F_6O_3$, to $O_2$ (perfluoro cyclic ether/$O_2$, e.g., $c$-$C_3F_6O_2/O_2$, $c$-$C_4F_8O_2/O_2$ or $c$-$C_3F_6O_3/O_2$) preferably satisfies the formula:

$$0.1 \leq (\text{perfluoro cyclic ether}/O_2, \text{ e.g., } c\text{-}C_3F_6O_2/O_2, c\text{-}C_4F_8O_2/O_2 \text{ or } c\text{-}C_3F_6O_3/O_2),$$

more preferably $$0.1 \leq (\text{perfluoro cyclic ether}/O_2, \text{ e.g., } c\text{-}C_3F_6O_2/O_2, c\text{-}C_4F_8O_2/O_2 \text{ or } c\text{-}C_3F_6O_3/O_2) \leq 20,$$

especially preferably $$0.1 \leq (\text{perfluoro cyclic ether}/O_2, \text{ e.g., } c\text{-}C_3F_6O_2/O_2, c\text{-}C_4F_8O_2/O_2 \text{ or } c\text{-}C_3F_6O_3/O_2) \leq 9.$$

Examples of the other gas, which is contained in the etching gas of the invention, include inert gases such as $N_2$, He, Ne, Ar, Kr, Xe and Rn. The inert gases may be used singly or in a mixed gas of two or more.

When the etching gas of the invention has a gas content and a mixing molar ratio in the above ranges, it is possible to attain the etching rate same as that of $C_2F_6$ conventionally used.

In an exhaust gas obtained after the etching, for example, when the etching is carried out using $C_2F_6$ as described above, $CF_4$ having a high global warming potential is contained as a by-product. On the other hand, when the etching gas for a silicon-containing film, which comprises $c$-$C_3F_6O_2$, $c$-$C_4F_8O_2$ or $c$-$C_3F_6O_3$ and $O_2$, is used, it is possible to attain the etching rate same as that of $C_2F_6$ and also to decrease the $CF_4$ content in the exhaust gas markedly as compared with the use of $C_2F_6$.

The etching gas of the invention also has a very high decomposition rate of the gas used (perfluoro cyclic ether is used in the present invention) and excellent etching efficiency as compared with $C_2F_6$.

Of these, $c$-$C_3F_6O_2$ has a low boiling point of $-22.1°$ C. and a nontoxic gas under semiconductor production conditions so that $c$-$C_3F_6O_2$ has easy handling in the etching. Therefore, among $c$-$C_3F_6O_2$, $c$-$C_4F_8O_2$ and $c$-$C_3F_6O_3$, it is preferred to use $c$-$C_3F_6O_2$ from the standpoint of easy handling.

The processes for producing these perfluoro cyclic ethers are the same as described above.

The etching gas of the invention has good selectivity for a workpiece film and is sufficiently practicable as an alternate gas to $C_2F_6$, etc.

When $C_2F_6$ is used as an etching gas, the proportion of the waste gas such as $CF_4$ in exhaust gas is increased by increasing electric power for etching. On the other hand, using the etching gas of the invention, the increase of the proportion of the waste gas such as $CF_4$ can be restrained markedly.

When the etching is carried out using $C_2F_6$, the exhaust gas contains $CF_4$ that has a long atmospheric life of 50,000 years and a high global warming potential. On the other hand, the etching rate with the etching gases of the invention is about 70% of the etching rate with $C_2F_6$. Further, the $CF_4$ content in the exhaust gas from the etching gases of the invention can be decreased as compared with that in the exhaust gas from $C_2F_6$.

(Other Arbitrary Component)

The other gas as described above, further, may contain gases except for the above inert gases within the limit of not missing the object of the present invention. Examples of the gases except for the inert gases may include $O_3$, $H_2$, $F_2$, $ClF_3$, $BrF_3$ and $NF_3$.

<Etching>

Examples of a target compound for the etching include a thin film containing silicon (a silicon-containing film).

The silicon-containing film comprises at least one film selected from (1) a silicon film;

(2) a film comprising silicon and at least one element of oxygen, nitrogen, fluorine and carbon; and (3) a film comprising a metal silicide with high melting point.

Specific examples thereof include a Si film; a $SiO_2$ film; a $Si_3N_4$ film; metal silicide films with high melting point such as a WSi film; etc.

As the process for etching such a silicon-containing film with the etching gas of the invention, conventionally known methods can be employed, and examples thereof include various dry etching methods such as plasma etching, reactive ion etching, microwave etching. Further, conventionally known etching conditions can be employed as the etching conditions for a silicon-containing film.

EXAMPLES

Hereinafter, the present invention is described in more detail with reference to the following non-limiting examples.

With regard to $CF_4$ contained in exhaust gas generated during cleaning, the exhaust gas was diluted with nitrogen in an amount of 15.5 L/min and measured by FT-IR.

Examples 1 to 5

(Chamber Cleaning)

In each example, a silicon wafer deposited a $SiO_2$ film was placed in a CVD chamber and the $SiO_2$ film was cleaned off using a mixed gas of $c-C_3F_6O_2$ and oxygen in a proportion as shown in Table 1 under conditions of a pressure of 250 Pa, an input Rf electric power of 1000 W, a total gas flow rate of 300 sccm, an electrode temperature of 300° C. and a distance between electrodes of 50 mm. The cleaning was carried out for 0.5 min under the above conditions. The results are shown in Table 1.

The $CF_4$ content in the exhaust gas generated during the cleaning is shown in Table 1.

TABLE 1

| Composition of cleaning gas | Ex. 1 | Ex. 2 | Ex. 3 | Ex. 4 | Ex. 5 |
|---|---|---|---|---|---|
| $C-C_3F_6O_2$ content (mol %) | 10 | 20 | 30 | 40 | 50 |
| $O_2$ content (mol %) | 90 | 80 | 70 | 60 | 50 |
| $C-C_3F_6O_2/O_2$ | 0.11 | 0.25 | 0.43 | 0.67 | 1.00 |
| Ratio of $(c-C_3F_6O_2 + O_2)$ to the total gas amount (mol %) | 100 | 100 | 100 | 100 | 100 |
| Cleaning rate (Å/min) | 5,280 | 8,340 | 10,500 | 11,430 | 11,350 |
| $CF_4$ content in exhaust gas (%) | 0.013 | 0.038 | 0.085 | 0.169 | 0.320 |
| Decomposition rate of $c-C_3F_6O_2$ (%) | 94.7 | 94.8 | 95.7 | 96.5 | 96.0 |

Examples 6 to 10

(Chamber Cleaning)

In each example, a silicon wafer deposited a $SiO_2$ film was placed in a CVD chamber and the $SiO_2$ film was cleaned off using a mixed gas of $c-C_3F_6O_2$ and oxygen in a proportion as shown in Table 2 under conditions of a pressure of 250 Pa, an input Rf electric power of 750 W, a total gas flow rate of 300 sccm, an electrode temperature of 300° C. and a distance between electrodes of 50 mm. The cleaning was carried out for 0.5 min under the above conditions. The results are shown in Table 2.

The $CF_4$ content in the exhaust gas generated during the cleaning is shown in Table 2.

TABLE 2

| Composition of cleaning gas | Ex. 6 | Ex. 7 | Ex. 8 | Ex. 9 | Ex. 10 |
|---|---|---|---|---|---|
| $c-C_3F_6O_2$ content (mol %) | 10 | 20 | 30 | 40 | 50 |
| $O_2$ content (mol %) | 90 | 80 | 70 | 60 | 50 |
| $c-C_3F_6O_2/O_2$ | 0.11 | 0.25 | 0.43 | 0.67 | 1.00 |
| Ratio of $(c-C_3F_6O_2 + O_2)$ to the total gas amount (mol %) | 100 | 100 | 100 | 100 | 100 |
| Cleaning rate (Å/min) | 4,560 | 7,620 | 9,190 | 9,930 | 9,120 |
| $CF_4$ content in exhaust gas (%) | 0.014 | 0.040 | 0.090 | 0.171 | 0.320 |
| Decomposition rate of $c-C_3F_6O_2$ (%) | 91.4 | 90.9 | 91.5 | 91.5 | 91.1 |

Examples 11 to 14

(Chamber Cleaning Gas)

In each example, a silicon wafer deposited a $SiO_2$ film was placed in a CVD chamber and the $SiO_2$ film was cleaned off using a mixed gas of $c-C_4F_8O_2$ and oxygen in a proportion as shown in Table 3 under conditions of a pressure of 250 Pa, an input Rf electric power of 1000 W, a total gas flow rate of 300 sccm, an electrode temperature of 300° C. and a distance between electrodes of 50 mm. The cleaning was carried out for 0.5 min under the above conditions. The results are shown in Table 3.

The $CF_4$ content in the exhaust gas generated during the cleaning is shown in Table 3.

TABLE 3

| Composition of cleaning gas | Ex. 11 | Ex. 12 | Ex. 13 | Ex. 14 |
|---|---|---|---|---|
| $c-C_4F_8O_2$ content (mol %) | 10 | 20 | 30 | 40 |
| $O_2$ content (mol %) | 90 | 80 | 70 | 60 |
| $c-C_4F_8O_2/O_2$ | 0.11 | 0.25 | 0.43 | 0.67 |
| Ratio of $(c-C_4F_8O_2 + O_2)$ to the total gas amount (mol %) | 100 | 100 | 100 | 100 |
| Cleaning rate (Å/min) | 6,620 | 9,960 | 11,250 | 10,130 |
| $CF_4$ content in exhaust gas (%) | 0.031 | 0.104 | 0.220 | 0.430 |
| Decomposition rate of $c-C_4F_8O_2$ (%) | 100 | 99.8 | 99.9 | 100 |

Examples 15 to 18

(Chamber Cleaning)

In each example, a silicon wafer deposited a $SiO_2$ film was placed in a CVD chamber and the $SiO_2$ film was cleaned off using a mixed gas of $c-C_4F_8O_2$ and oxygen in a proportion as shown in Table 4 under conditions of a pressure of 250 Pa, an input Rf electric power of 750 W, a total gas flow rate of 300 sccm, an electrode temperature of 300° C. and a distance between electrodes of 50 mm.

The cleaning was carried out for 0.5 min under the above conditions. The $CF_4$ content in the exhaust gas generated during the cleaning is shown in Table 4.

TABLE 4

| Composition of cleaning gas | Ex. 15 | Ex. 16 | Ex. 17 | Ex. 18 |
|---|---|---|---|---|
| $c-C_4F_8O_2$ content (mol %) | 10 | 20 | 30 | 40 |
| $O_2$ content (mol %) | 90 | 80 | 70 | 60 |
| $c-C_4F_8O_2/O_2$ | 0.11 | 0.25 | 0.43 | 0.67 |

TABLE 4-continued

| Composition of cleaning gas | Ex. 15 | Ex. 16 | Ex. 17 | Ex. 18 |
|---|---|---|---|---|
| Ratio of ($c$-$C_4F_8O_2$ + $O_2$) to the total gas amount (mol %) | 100 | 100 | 100 | 100 |
| Cleaning rate (Å/min) | 5950 | 8780 | 9560 | 8820 |
| $CF_4$ content in exhaust gas (%) | 0.036 | 0.105 | 0.230 | 0.440 |
| Decomposition rate of $c$-$C_4F_8O_2$ (%) | 100 | 99.5 | 99.6 | 99.6 |

Examples 19 to 21

(Chamber Cleaning Gas)

In each example, a silicon wafer deposited a $SiO_2$ film was placed in a CVD chamber and the $SiO_2$ film was cleaned off using a mixed gas of $c$-$C_3F_6O_2$, oxygen and an inert gas in a proportion as shown in Table 5 under conditions of a pressure of 250 Pa, an input Rf electric power of 1000 W, a total gas flow rate of 300 sccm, an electrode temperature of 300° C. and a distance between electrodes of 50 mm. The cleaning was carried out for 0.5 min under the above conditions. The results are shown in Table 5.

The $CF_4$ content in the exhaust gas generated during the cleaning is shown in Table 5.

TABLE 5

| Composition of cleaning gas | Ex. 19 | Ex. 20 | Ex. 21 |
|---|---|---|---|
| $c$-$C_3F_6O_2$ content (mol %) | 36 | 36 | 36 |
| $O_2$ content (mol %) | 54 | 54 | 54 |
| $c$-$C_3F_6O_2$/$O_2$ | 0.66 | 0.66 | 0.66 |
| $c$-$C_3F_6O_2$/($c$-$C_3F_6O_2$ + $O_2$) | 0.40 | 0.40 | 0.40 |
| Content of inert gas added (mol %) | Argon: 10 | Nitrogen: 10 | Helium: 10 |
| Ratio of ($c$-$C_3F_6O_2$ + $O_2$) to the total gas amount (mol %) | 90 | 90 | 90 |
| Cleaning rate (Å/min) | 11,128 | 10,425 | 10,855 |
| $CF_4$ content in exhaust gas (%) | 0.144 | 0.148 | 0.143 |
| Decomposition rate of $c$-$C_3F_6O_2$ (%) | 95.9 | 95.4 | 95.3 |

Comparative Examples 1 to 7

(Chamber Cleaning)

In each example, a $SiO_2$ film was cleaned off using a mixed gas of $C_2F_6$ and oxygen in a proportion as shown in Table 6 under the same conditions as in Examples 6 to 10. The results are shown in Table 6.

The $CF_4$ content in the exhaust gas, generated during the cleaning is shown in Table 6.

TABLE 6

| Composition of cleaning gas | Comp. Ex. 1 | Comp. Ex. 2 | Comp. Ex. 3 | Comp. Ex. 3 | Comp. Ex. 4 | Comp. Ex. 5 | Comp. Ex. 6 |
|---|---|---|---|---|---|---|---|
| $C_2F_6$ content (mol %) | 20 | 30 | 40 | 45 | 50 | 60 | 70 |
| $O_2$ content (mol %) | 80 | 70 | 60 | 55 | 50 | 40 | 30 |
| $C_2F_6/O_2$ | 0.25 | 0.43 | 0.67 | 0.82 | 1.00 | 1.50 | 2.33 |
| Ratio of ($C_2F_6$ + $O_2$) to the total gas amount (mol %) | 100 | 100 | 100 | 100 | 100 | 100 | 100 |
| Cleaning rate (Å/min) | 7,810 | 10,050 | 11,810 | 12,270 | 12,410 | 11,140 | 7,590 |
| $CF_4$ content in exhaust gas (%) | 0.061 | 0.129 | 0.230 | 0.276 | 0.360 | 0.626 | 0.970 |
| Decomposition rate of $C_2F_6$ (%) | 65.8 | 65.0 | 64.1 | 62.6 | 63.2 | 62.3 | 61.0 |

(Remark)
It is not preferred that the $CF_4$ content in the exhaust gas is large because the global warming function becomes high.

INDUSTRIAL APPLICABILITY

The chamber-cleaning gas of the present invention comprises the specific perfluoro cyclic ether and exhibits an excellent cleaning rate almost same as that of a conventional cleaning gas $C_2F_6$. Further, the use of the chamber-cleaning gas of the invention can remarkably reduce the generation of $CF_4$ which is a harmful gas for environment and is one of the causes of global warming. Furthermore, the chamber-cleaning gas of the invention has easy handling, and the exhaust gas from the chamber-cleaning gas can be easily treated. Therefore, the chamber-cleaning gas of the invention can improve economic properties and workability.

The etching gas for a silicon-containing film according to the present invention comprises the specific perfluoro cyclic ether and exhibits an excellent etching rate almost same as that of a conventional etching gas $C_2F_6$. Further, the use of the etching gas of the invention can remarkably reduce the generation of $CF_4$ which is a harmful gas for environment and is one of the causes of global warming. Furthermore, the etching gas of the invention has easy handling, and the exhaust gas from the etching gas can be easily treated. Therefore, the etching gas of the invention can improve economic properties and workability. The etching gas of the invention enables the efficient removal of the silicon-containing film and the etching of a semiconductor pattern with a high dimensional accuracy. That is, the etching gas has excellent etching properties.

What is claimed is:

1. A chamber-cleaning gas comprising a perfluoro cyclic ether having 2 to 4 oxygen atoms which are ether-linked with carbon atoms, $O_2$ and optionally another gas, wherein a molar ratio of the perfluoro cyclic ether to $O_2$ (perfluoro cyclic ether/$O_2$) satisfies the formula:

0.1 ≦ perfluoro cyclic ether/$O_2$ ≦ 9.

2. The chamber-cleaning gas as claimed in claim 1, wherein the perfluoro cyclic ether is represented by the following formula (1):

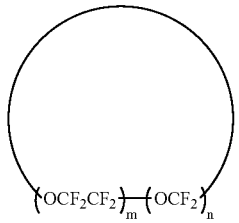

(1)

in which m is an integer of 0 to 2 and n is an integer of 0 to 3, provided that m and n are not simultaneously zero, they are not simultaneously m=0 and n=1, they are not simultaneously m=1 and n=0, and they are not simultaneously m=2 and n=3.

3. The chamber-cleaning gas as claimed in claim 1, wherein the perfluoro cyclic ether is a cyclic ether having a five- to eight-membered ring.

4. The chamber-cleaning gas as claimed in claim 1, wherein the total amount of the perfluoro cyclic ether and $O_2$ is 10 to 100 mol % based on 100 mol % of the total gas amount.

5. The chamber-cleaning gas as claimed in claim 4, wherein the total amount of the perfluoro cyclic ether and $O_2$ is 70 to 100 mol % based on 100 mol % of the total gas amount.

6. The chamber-cleaning gas as claimed in claim 1, wherein the molar ratio of the perfluoro cyclic ether to $O_2$ (perfluoro cyclic ether/$O_2$) satisfies the formula:

0.10 ≦ perfluoro cyclic ether/$O_2$ ≦ 6.

7. The chamber-cleaning gas as claimed in claim 1, wherein the perfluoro cyclic ether is at least one compound selected from the group consisting of perfluoro-1,3-dioxolane (c-$C_3F_6O_2$), perfluoro-1,4-dioxane (c-$C_4F_8O_2$) and perfluoro-1,3,5-trioxane (c-$C_3F_6O_3$).

8. The chamber-cleaning gas as claimed in claim 1, wherein the other gas comprises at least one inert gas selected from the group consisting of $N_2$, He, Ne, Ar, Kr, Xe and Rn.

9. The chamber-cleaning gas as claimed in claim 1, which is used for cleaning a chamber of a CVD apparatus.

10. The chamber-cleaning gas as claimed in claim 1, which is used for removing a silicon-containing deposit.

11. The chamber-cleaning gas as claimed in claim 10, wherein the silicon-containing deposit comprises at least one compound selected from the group consisting of:

(1) silicon;

(2) a compound comprising silicon and at least one element of oxygen, nitrogen, fluorine and carbon; and (3) a compound comprising a metal silicide with high melting point.

12. An etching gas used for a silicon-containing film comprising a perfluoro cyclic ether having 2 to 4 oxygen atoms which are ether-linked with carbon atoms, $O_2$ and optionally another gas, wherein a molar ratio of the perfluoro cyclic ether to $O_2$ (perfluoro cyclic ether/$O_2$) satisfies the formula:

0.1 ≦ perfluoro cyclic ether/$O_2$ ≦ 9.

13. The etching gas used for a silicon-containing film as claimed in claim 12, wherein the perfluoro cyclic ether is represented by the formula (1):

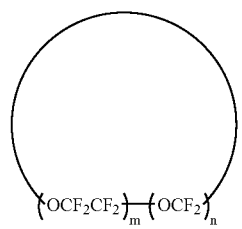

(1)

in which m is an integer of 0 to 2 and n is an integer of 0 to 3, provided that m and n are not simultaneously zero, they are not simultaneously m=0 and n=1, they are not simultaneously m=1 and n=0, and they are not simultaneously m=2 and n=3.

14. The etching gas used for a silicon-containing film as claimed in claim 12, wherein the perfluoro cyclic ether is a cyclic ether having a five- to eight-membered ring.

15. The etching gas used for a silicon-containing film as claimed in claim 12, wherein the total amount of the perfluoro cyclic ether and $O_2$ is 10 to 100 mol % based on 100 mol % of the total gas amount.

16. The etching gas used for a silicon-containing film as claimed in claim 12, wherein the perfluoro cyclic ether is at least one compound selected from group consisting of perfluoro-1,3-dioxolane (c-$C_3F_6O_2$), perfluoro-1,4-dioxane (c-$C_4F_8O_2$) and perfluoro-1,3,5-trioxane (c-$C_3F_6O_3$).

* * * * *